United States Patent
Chao et al.

(10) Patent No.: US 7,264,483 B2
(45) Date of Patent: Sep. 4, 2007

(54) MODULES FOR FIXING FLEXIBLE PRINTED CIRCUIT BOARDS AND FLAT DISPLAY DEVICES UTILIZING THE SAME

(75) Inventors: Chih-Chung Chao, Hsinchu (TW); Che-Chih Chang, Miaoli County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/684,074

(22) Filed: Mar. 9, 2007

(65) Prior Publication Data

US 2007/0167041 A1    Jul. 19, 2007

Related U.S. Application Data

(62) Division of application No. 11/002,503, filed on Dec. 2, 2004, now Pat. No. 7,241,148.

(30) Foreign Application Priority Data

Jul. 13, 2004   (TW) ............................... 93210979 U

(51) Int. Cl.
*H01R 12/00* (2006.01)

(52) U.S. Cl. ..................................................... 439/67

(58) Field of Classification Search ................. 439/67, 439/77, 495; 361/800; 349/149, 150
See application file for complete search history.

(56) References Cited

U.S. PATENT DOCUMENTS

| 4,411,633 A | 10/1983 | Waldron |
| 6,836,310 B2 | 12/2004 | Yamazaki et al. |
| 6,974,333 B2 | 12/2005 | Wildes et al. |
| 7,033,185 B2 | 4/2006 | Kuo et al. |

*Primary Examiner*—Khiem Nguyen
(74) *Attorney, Agent, or Firm*—Thomas, Kayden, Horstemeyer & Risley

(57) ABSTRACT

Modules for fixing flexible printed circuit boards. A module comprises a casing and a flexible printed circuit board. The casing has a recess on a lateral side. The flexible printed circuit board has a flexible portion disposed in the recess, wherein the thickness of the flexible portion is substantially equal to the thickness of the recess.

8 Claims, 4 Drawing Sheets

MODULES FOR FIXING FLEXIBLE PRINTED CIRCUIT BOARDS AND FLAT DISPLAY DEVICES UTILIZING THE SAME

CROSS-REFERENCE TO RELATED APPLICATION

This application is a division of U.S. patent application Ser. No. 11/002,503, filed Dec. 2, 2004 now U.S. Pat. No. 7,241,148.

BACKGROUND

The present invention relates in general to modules for fixing flexible printed circuit boards and in particular to modules for fixing flexible printed circuit boards employed in flat display devices.

Conventional flat display devices, such as liquid crystal displays, are typically connected to external circuits through flexible printed circuit boards. As shown in FIG. 1a, the flexible printed circuit board 1 comprises first, second and third conductive portions 11, 12 and 13 for signal transmission, wherein the first and second conductive portions 11 and 12 are disposed on opposite borders of the flexible printed circuit board 1. The first conductive portion 11 comprises a plurality of contact pads 110 electrically connected to external circuits (not shown), and correspondingly, the second conductive portion 12 comprises a plurality of contact pads 120 electrically connected to a main body M with an LCD panel disposed therein.

Specifically, a U-shaped slot 10 is defined on the flexible printed circuit board 1 forming a flexible portion 130. Referring to FIGS. 1a and 1b, the third conductive portion 13 is disposed on the flexible portion 130 and electrically connected to the main body M as the flexible portion 130 is flexed upward. Since the flexible portion 130 of the flexible printed circuit board 1 is generally connected to the main body M by adhesive, it may peel during long-term usage. Moreover, due to small adhesive area between the flexible portion 130 and the main body M, robust connection can be difficult.

SUMMARY

Modules for fixing flexible printed circuit boards and flat display devices utilizing the same are provided. An exemplary embodiment of a module comprises a casing and a flexible printed circuit board. The casing has a recess on a lateral side. The flexible printed circuit board has a flexible portion disposed in the recess, wherein the thickness of the flexible portion is substantially equal to the thickness of the recess.

An exemplary embodiment of a flat display device comprises a casing, a flexible printed circuit board and a flat display panel. The casing has a recess on a lateral side, and the flat display panel is disposed in the casing. The flexible printed circuit board has a flexible portion disposed in the recess, wherein the thickness of the flexible portion is substantially equal to the thickness of the recess.

BRIEF DESCRIPTION OF THE DRAWINGS

The present invention will become more fully understood from the following detailed description and the accompanying drawings, given by the way of illustration only and thus not intended to limit the disclosure.

FIG. 1b is a perspective view of a flexible portion of the flexible printed circuit board adhering to the main body shown in FIG. 1a;

DETAILED DESCRIPTION

First Embodiment

Figure 1A:
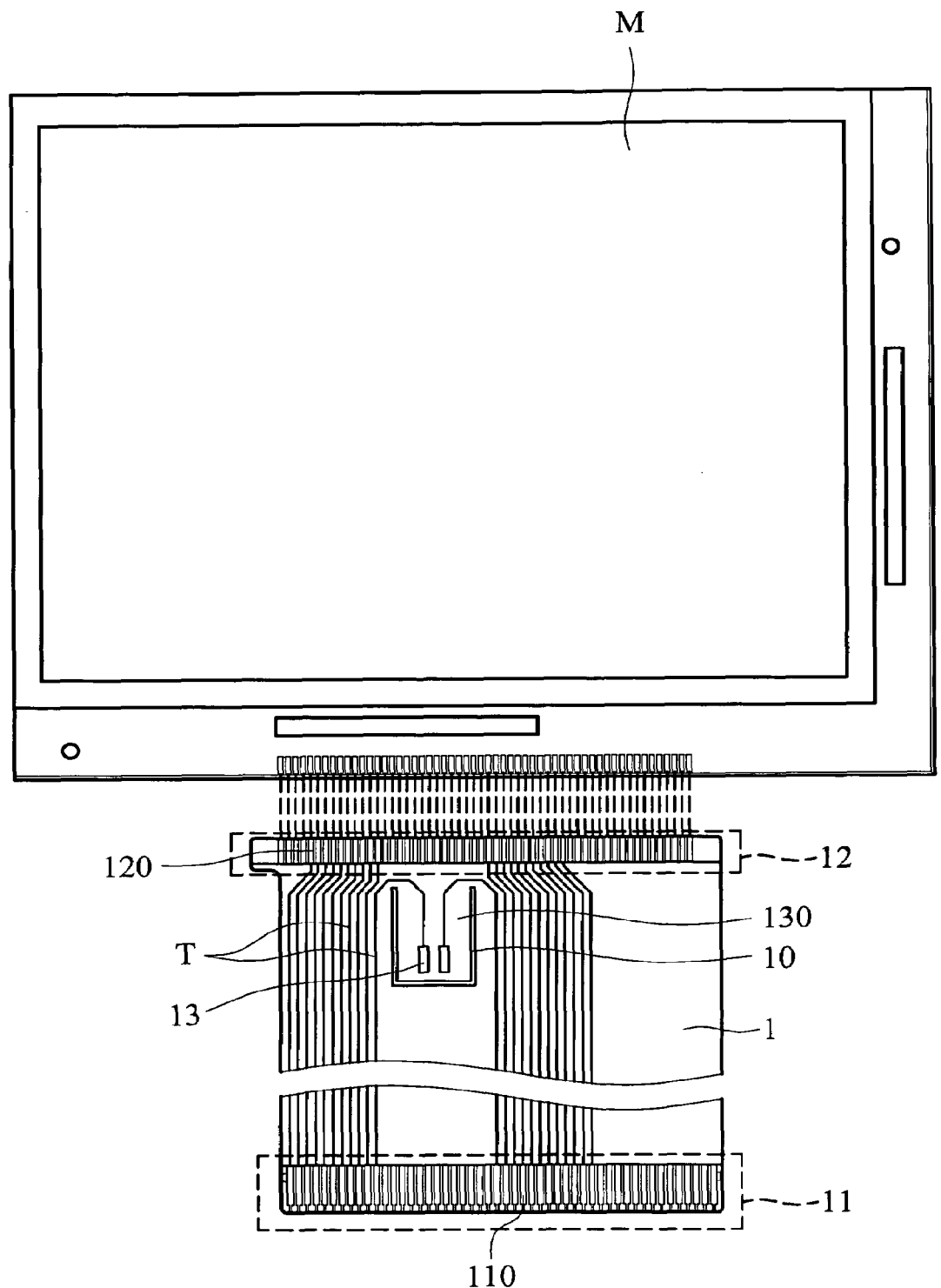
FIG. 1a is a perspective view of a conventional LCD module provided with a flexible printed circuit board connecting to a main body.
Figure 1B:
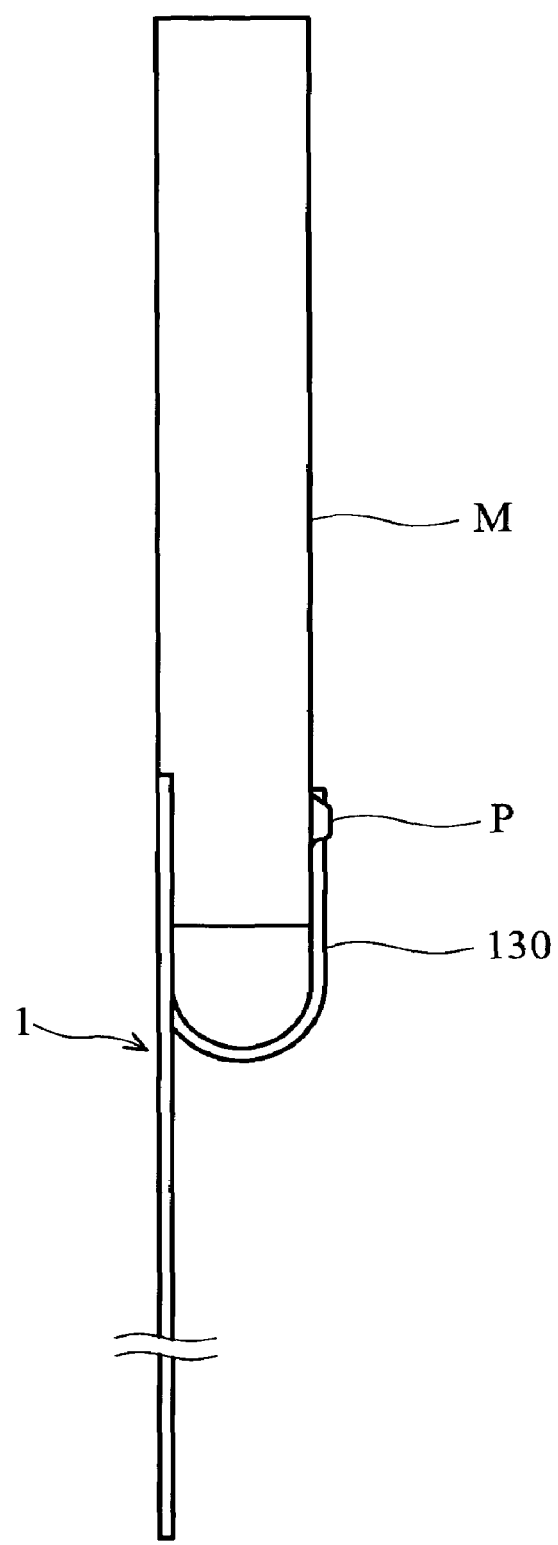
Figure 2:
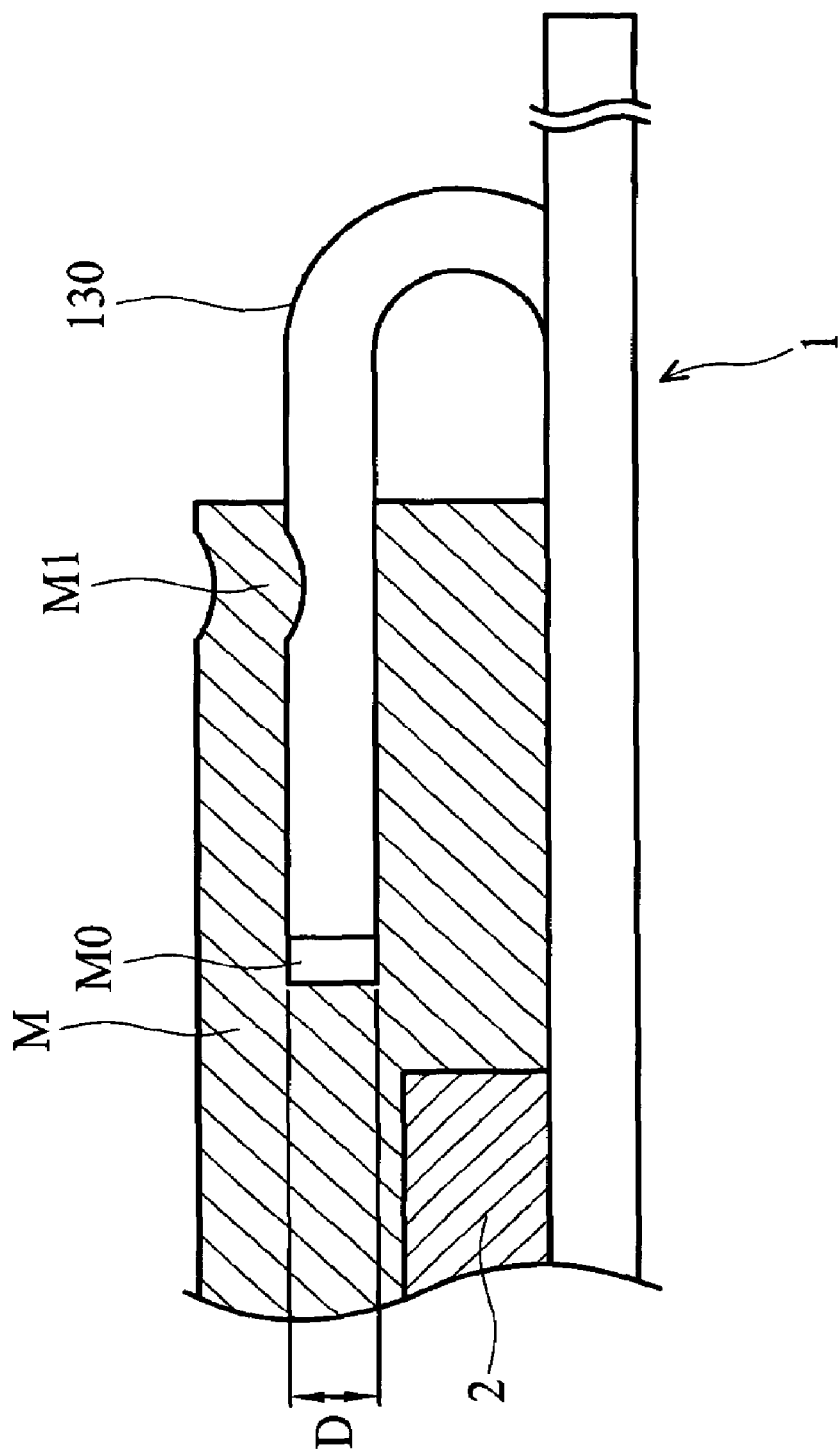
FIG. 2 is a perspective view of a flexible circuit board connecting to a casing according to the first embodiment of the invention.

This embodiment according to the present invention provides a module for fixing a flexible printed circuit board with a flexible portion of flexible printed circuit board press-fitted in a casing. Referring to FIG. 2, the present embodiment provides a flat display device, such as a liquid crystal display, comprising a flexible printed circuit board 1, a casing M, and a flat display panel 2. The casing M has a recess M0, and the flexible printed circuit board 1 has a flexible portion 130 flexing leftward and joining in the recess M0. The flat display panel 2 connecting with the flexible printed circuit board 1 is disposed in the casing M. Specifically, the casing M has a clamp portion M1 formed on the inner surface of the recess M0. As shown in FIG. 2, the clamp portion M1 projects from the inner surface of the recess M0, with the thickness D of the recess M0 substantially equal to the thickness of the flexible portion 130. The flexible portion 130 can be press-fitted in the recess M0 by slight deformation of the clamp portion M1. As mentioned, the clamp portion M1's slight deformation exerts a downward force on the flexible portion 130 such that the flexible printed circuit board 1 and the casing M are firmly connected.

Second Embodiment

Figure 3:
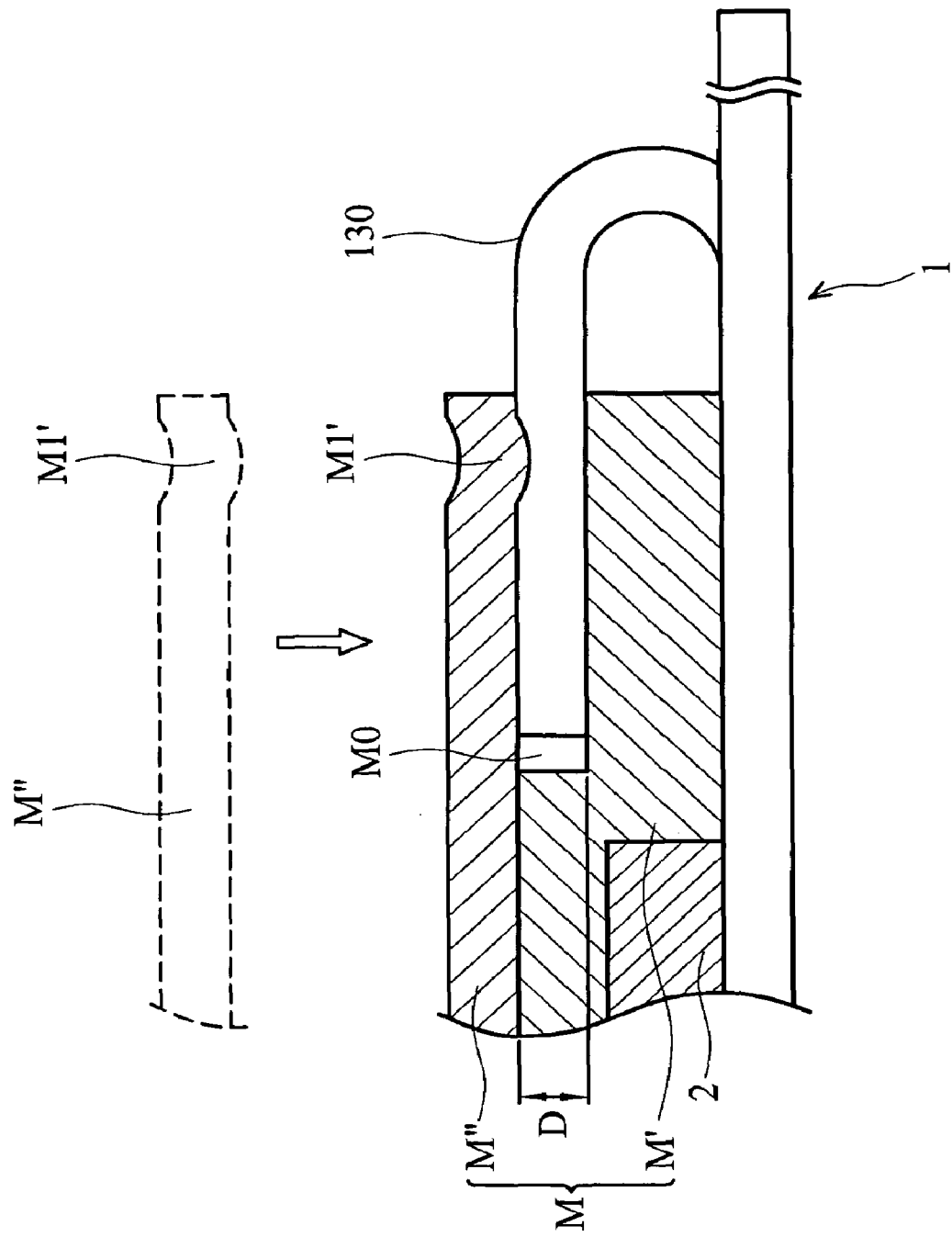
FIG. 3 is a perspective view of a flexible circuit board connecting to a casing according to the second embodiment of the invention.

Referring to FIG. 3, the flat display device of the present embodiment, such as a liquid crystal display, comprises a flexible printed circuit board 1, a casing M and a flat display panel 2. Specifically, the casing M includes a first portion M' and a second portion M" joined to each other. As shown in FIG. 3, a recess M0 is defined between the first portion M' and the second portion M" when they are joined, wherein a flexible portion 130 of the flexible printed circuit board 1 flexes leftward and joins in the recess M0. The flat display panel 2 connecting with the flexible printed circuit board 1 is disposed in the casing M.

Furthermore, the second portion M" comprises a clamp portion M1' formed on the inner surface of the recess M0. In FIG. 3, the clamp portion M1' projects from the inner surface of the recess M0 with the thickness D of the recess M0 substantially equal to the thickness of the flexible portion 130. Thus, the flexible portion 130 can be press-fitted in the recess M0 by slight deformation of the clamp portion M1'. As mentioned, slight deformation of the clamp portion M1' exerts a downward force on the flexible portion 130 such that the flexible printed circuit board 1 and the casing M are firmly connected.

During assembly, first, the flexible portion 130 can be flexed leftward to the first portion M', then the second portion M" fixed to the first portion M' such that the flexible portion 130 is firmly secured in the recess M0 as shown in FIG. 3. Since the thickness D of the recess M0 is substantially equal to the thickness of the flexible portion 130, the flexible portion 130 can be press-fitted in the recess M0 by slight deformation of the clamp portion M1', whereby the clamp portion M1' exerts a force on the flexible portion 130 to firmly connect the flexible printed circuit board 1 and the casing M.

The first portion M' can be insulating material such as plastic, and the second portion M" can be metal. The first portion M' can be a frame, and the second portion M" can be a bezel. As the first portion M' and the second portion M" share relatively generous connection area, they can be secured by one or more screws, adhesive or clasp means.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A flat display device, comprising:
   a casing having a recess on a lateral side;
   a flexible printed board having a flexible portion disposed in the recess,
     wherein the thickness of the flexible portion is substantially equal to the thickness of the recess; and
   a flat display panel disposed in the casing.

2. The flat display device of claim 1, wherein the flexible printed board is press-fitted in the recess.

3. The flat display device of claim 1, wherein the casing comprises a clamp portion projecting from an inner surface of the recess.

4. The flat display device of claim 1, wherein the casing comprises a first portion and a second portion joined to each other to form the recess therebetween.

5. The flat display device of claim 4, wherein the first portion and the second portion are joined by one or more clasps.

6. The flat display device of claim 4, wherein the first portion and the second portion are joined by one or more screws.

7. The flat display device of claim 4, wherein the first portion is made of insulating material.

8. The flat display device as claimed in claim 4, wherein the second portion is made of metal.

* * * * *